United States Patent [19]

Laplante

[11] 4,118,727
[45] Oct. 3, 1978

[54] MOX MULTI-LAYER SWITCHING DEVICE COMPRISING NIOBIUM OXIDE

[75] Inventor: Paul R. Laplante, Falls Church, Va.

[73] Assignee: The United States of America as represented by the Secretary of the Army, Washington, D.C.

[21] Appl. No.: 831,849

[22] Filed: Sep. 9, 1977

[51] Int. Cl.$^2$ .................................................. H01L 29/12
[52] U.S. Cl. ......................................... 357/10; 357/2; 357/61; 357/59; 328/20
[58] Field of Search ................. 357/10, 2, 61, 59; 338/20, 21

[56] References Cited

U.S. PATENT DOCUMENTS

| 3,679,947 | 7/1972 | Chakravertz et al. | 317/234 R |
| 3,821,773 | 6/1974 | Mize | 357/16 |
| 3,962,715 | 6/1976 | Raccah et al. | 357/2 |

OTHER PUBLICATIONS

I.B.M. Tech. Discl. Bull., vol. 15, No. 4, Sep. 1972, p. 1286.
I.B.M. Tech. Discl. Bull., vol. 14, No. 11, Apr. 1972, p. 3365.

Primary Examiner—Martin H. Edlow
Attorney, Agent, or Firm—Nathan Edelberg; Jeremiah G. Murray; Bernard Franz

[57] ABSTRACT

At least two metal oxide switch devices sandwiched together with each device consisting of polycrystalline refractory transition metal oxide such as NbO$_2$ formed on a conducting refractory substrate such as single crystal NbO. The polycrystalline layers on opposing outer faces of the sandwich are removed and electrical contacts made thereto. The mutually contiguous polycrystalline surfaces form an active interface where switching is adapted to take place.

6 Claims, 4 Drawing Figures

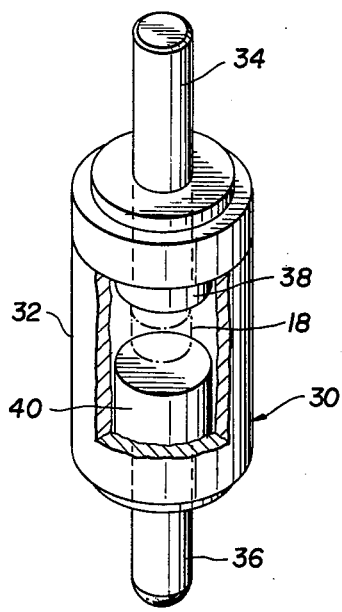
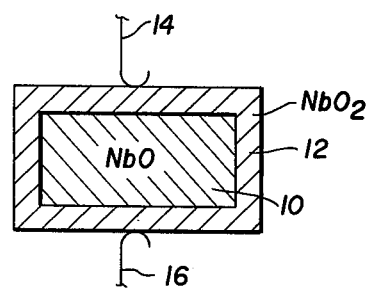
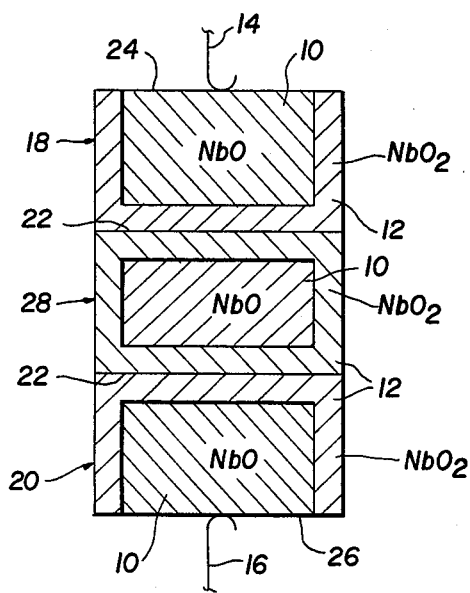
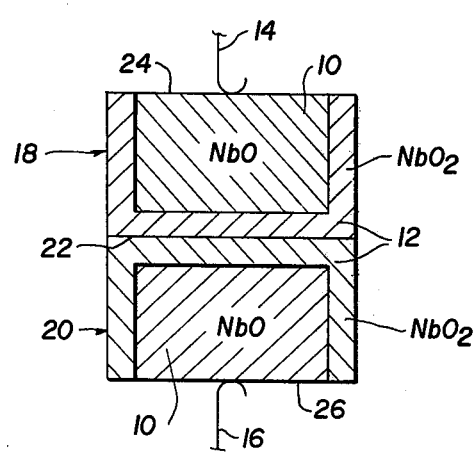
FIG. 4
FIG. 1 PRIOR ART
FIG. 3
FIG. 2

MOX MULTI-LAYER SWITCHING DEVICE COMPRISING NIOBIUM OXIDE

The invention described herein may be manufactured and used by or for the Government for governmental purposes without the payment of any royalties thereon or therefor.

BACKGROUND OF THE INVENTION

This invention relates generally to semiconductor protective devices utilized, for example, in suppressing transients in electronic circuits and more particularly to a metal oxide threshold switching device.

A metal oxide or MOX switching device consisting of a layer of polycrystalline refractory transition metal oxide, such as $NbO_2$ grown on a conducting refractory substrate such as a single crystal NbO is known, having been developed at Yeshiva University by Paul M. Raccah, Teodoro Halpern and Soo Hee Shin, and being shown and described in U.S. patent application Ser. No. 529,222 now U.S. Pat. No. 3,962,715. This normally high resistance device has the characteristic of becoming a low resistance device when subjected to a high voltage pulse. It is also capable of handling currents in the order of 80 amperes while maintaining a response time shorter than 0.7 nanoseconds. Its use as a transient suppression device is furthermore disclosed in U.S. Pat. No. 3,973,224 entitled "Tandem Configuration for EMP Protection", G. K. Gaule, et al., Aug. 3, 1976.

This device is made by contacting the active region by either a point or wide area pressure contact or by bonding a gold ribbon to a sputtered metallized pad of niobium or aluminum. Such a technique, for example, is disclosed in U.S. Ser. No. 729,519, entitled "Metal Oxide Threshold Switch Contact", by Paul R. Laplante, et al., one of the inventors being the inventor of the subject invention. Such prior art devices, however, are subject to failure due to shorting caused by the penetration of the active layer by the contact supplied thereto. It is to this inherent shortcoming that the present invention is directed.

SUMMARY

The present invention is directed to an improvement in niobium oxide threshold switching devices by providing a switching structure comprised of at least two metal oxide chips, each consisting of a polycrystalline layer formed, for example, by thermal oxidation on a single crystal substrate and being contiguously placed together such that a polycrystalline interface is formed thereby. A portion or all of the polycrystalline layer on the opposing outer faces of the sandwiched chips is removed and electrical contacts applied thereto in any desired fashion.

BRIEF DESCRIPTION OF THE DRAWINGS

The foregoing will be more readily apparent by reference to the following description when considered in conjunction with the drawings wherein:

FIG. 1 comprises a cross sectional diagram illustrative of a typical prior art metal oxide threshold switch;

FIG. 2 is a cross sectional diagram illustrative of a first embodiment of the subject invention;

FIG. 3 is a cross sectional diagram illustrative of a second embodiment of the subject invention; and FIG. 4 depicts an illustrative package partially cut away which is adapted to contain the switch device according to the subject invention.

DETAILED DESCRIPTION OF THE PREFERRED EMBODIMENTS

Referring now to FIG. 1, there is shown a typical prior art metal oxide (MOX) threshold switching protective device. Basically it consists of a chip or disc of a single crystal substrate 10 which may be, for example, niobium oxide (NbO) upon which a polycrystalline niobium dioxide ($NbO_2$) layer 12 is formed, for example, by a thermal oxidation process to a thickness in the order of 10 micrometers. The active region of the device comprises the outer polycrystalline layer 12. A pair of electrical contacts 14 and 16 are applied to the layer 12 and are of any desired type. For example, the contacts may take the form of a simple pressure contact or conductive epoxy to a metal pad or even a thermocompression or ultrasonic bonded wire. These contacts 14 and 16 normally form an integral part of a package for housing, not shown, but may take the form of the means shown in FIG. 4, to be described.

Referring now to the first embodiment of the subject invention, it consists of two metal oxide chips 18 and 20, of the type shown in FIG. 1, contiguously placed together to provide a polycrystalline $NbO_2$ interface 22. The polycrystalline $NbO_2$ material is removed from opposing sides or faces of the sandwiched devices 18 and 20 to provide exposed outer faces 24 and 26 of the single crystal substrate 10, to which external electrical contacts 14 and 16 of any desired type are applied.

In operation, the switching occurs at the active interface 22. During initial switching, arcing occurs radially from the active interface 22 resulting in a bonding or welding of the two chips. After this initial welding occurs, no further arcing occurs causing a more stable operating device to be formed. A device according to the embodiment shown in FIG. 2 has been observed to sustain over 200 pulses of 100 microseconds duration and 2300 volts amplitude with an accompanying current in excess of 90 amperes. Such a structure as shown in FIG. 2 overcomes the limitations of the prior art in that the sandwich configuration results in a device which is self contacting thereby making the external contact unimportant with respect to the active device area.

Referring now to FIG. 3, a second embodiment of the subject invention is shown which is similar to the embodiment shown in FIG. 1, but now discloses means by which a relatively higher threshold voltage can be obtained. This is achieved simply by introducing one or more metal oxide chips 28 intermediate basic chips 18 and 20, while still providing the exposed NbO faces 24 and 26. What is introduced is a plurality of $NbO_2$ interfaces 22 which effectively increase the oxide layer thickness beyond what is readily obtainable by standard thermal oxidation methods. Again, since the bonding of the electrodes 14 and 16 is to the NbO single crystal substrates 10 at the faces 24 and 26, rather than to the active layer 12, all electrode penetration and material migration problems are obviated and as a consequence, any standard metallization and bonding method can be used without fear of altering the device operating parameters. The switching speed is still within a nanosecond and the device capacitance is within several picofarads.

FIG. 4 is intended to illustrate a typical commercial microwave diode package 30 which is adapted to contain the device according to the subject invention shown in FIGS. 2 and 3, and includes a cylindrical body portion 32 shown in cutaway section. A pair of relatively heavy external contact leads 34 and 36 protrude externally from each end of the housing 32. The external leads 34 and 36 terminate for example in circular platforms 38 and 40, to which the NbO faces 24 and 26 shown in FIGS. 2 and 3 are electrically connected. The electrical leads 14 and 16 shown in FIGS. 2 and 3 may, in fact, consist of the platforms 38 and 40 when desired, or other selected contact means may be employed without departing from the spirit or scope of the invention.

Having thus shown and disclosed what is at present considered to be the preferred embodiments of the subject invention, I claim:

1. An electrical threshold switching device comprising in combination:
    a first and second metal oxide device, each consisting of a single crystal metal oxide substrate having a layer of polycrystalline oxide material formed on the outer surface thereof and having an exposed substrate region devoid of said polycrystalline oxide material, contiguously placed together to define an active interface of polycrystalline material wherein switching occurs during operation while providing a pair of exposed substrate regions, one on each device wherein said single crystal substrate is comprised of niobium oxide and said polycrystalline material comprises niobium dioxide and
    electrical contact means applied to said pair of exposed substrate regions.

2. The electrical threshold switching device as defined by claim 1 wherein said first and second metal oxide device each comprises a chip having a pair of opposed faces and wherein said exposed substrate region comprises one opposed face of each device and said active interface comprises mutually opposite faces of each device.

3. The electrical threshold switching device as defined by claim 1 wherein said layer of polycrystalline material is of a thickness substantially equal to 10 micrometers.

4. The electrical threshold switching device as defined by claim 1 and additionally including at least one intermediate metal oxide device, consisting of a single crystal niobium oxide substrate having a layer of polycrystalline niobium dioxide material formed substantially on all of the outer surfaces thereof, contiguously between said first and second metal oxide device thereby defining a plurality of second active interfaces of polycrystalline material.

5. The electrical threshold switching device as defined by claim 3 wherein said first, second and at least one intermediate metal oxide device are stacked one upon the other and wherein said exposed substrate regions are at opposite ends of the resulting sandwiched structure.

6. The electrical threshold switching device as defined by claim 4 wherein said $NbO_2$ is formed on the outer surface of said substrate to a thickness of at least 10 micrometers.

* * * * *